(12) United States Patent
Chan et al.

(10) Patent No.: US 8,502,082 B2
(45) Date of Patent: Aug. 6, 2013

(54) CIRCUITIZED SUBSTRATE UTILIZING THREE SMOOTH-SIDED CONDUCTIVE LAYERS AS PART THEREOF AND ELECTRICAL ASSEMBLIES AND INFORMATION HANDLING SYSTEMS UTILIZING SAME

(75) Inventors: Benson Chan, Vestal, NY (US); John M. Lauffer, Waverly, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 1145 days.

(21) Appl. No.: 11/215,206

(22) Filed: Aug. 31, 2005

(65) Prior Publication Data

US 2006/0180343 A1 Aug. 17, 2006

Related U.S. Application Data

(62) Division of application No. 10/991,451, filed on Nov. 19, 2004, now Pat. No. 6,964,884.

(51) Int. Cl.
*H05K 1/03* (2006.01)
*H05K 1/09* (2006.01)

(52) U.S. Cl.
USPC .......................................... 174/256; 257/678

(58) Field of Classification Search
USPC ..... 257/753, 678, E23.106, E23.161; 216/18; 174/256–258
See application file for complete search history.

(56) References Cited

U.S. PATENT DOCUMENTS

| | | | | |
|---|---|---|---|---|
| 4,127,438 A | * | 11/1978 | Babcock et al. | ................ 216/20 |
| 5,096,522 A | | 3/1992 | Kawachi et al. | |
| 5,122,858 A | * | 6/1992 | Mahulikar et al. | ............ 257/753 |
| 5,437,914 A | | 8/1995 | Saida et al. | |
| 5,482,784 A | | 1/1996 | Ohara et al. | |
| 5,545,466 A | | 8/1996 | Saida et al. | |
| 5,707,893 A | * | 1/1998 | Bhatt et al. | ...................... 216/18 |
| 5,897,761 A | | 4/1999 | Tagusari et al. | |
| 6,291,081 B1 | | 9/2001 | Kurabe et al. | |
| 6,475,638 B1 | | 11/2002 | Mitsuhashi et al. | |
| 6,663,946 B2 | * | 12/2003 | Seri et al. | ...................... 428/209 |
| 6,784,504 B2 | * | 8/2004 | Derderian et al. | ............ 257/396 |
| 6,962,642 B2 | * | 11/2005 | Knadle et al. | ............... 156/273.9 |
| 2003/0231099 A1 | * | 12/2003 | Schemenaur et al. | ........ 338/308 |

FOREIGN PATENT DOCUMENTS

JP 5-160208 6/1993

* cited by examiner

*Primary Examiner* — Calvin Lee
*Assistant Examiner* — Monica D Harrison
(74) *Attorney, Agent, or Firm* — Mark Levy; Hinman, Howard & Kattell, LLP; Lawrence R. Fraley

(57) ABSTRACT

A circuitized substrate in which three conductive layers (e.g., electroplated copper foil) are bonded (e.g., laminated) to two dielectric layers. Each of the foil surfaces which physically bond to a respective dielectric layer are smooth (e.g., preferably by chemical processing) and may include a thin, organic layer thereon. One of the conductive layers may function as a ground or voltage (power) plane while the other two may function as signal planes with a plurality of individual signal lines as part thereof. An electrical assembly and an information handling system utilizing such a circuitized substrate are also provided, as is a method of making the substrate.

17 Claims, 4 Drawing Sheets

CIRCUITIZED SUBSTRATE UTILIZING THREE SMOOTH-SIDED CONDUCTIVE LAYERS AS PART THEREOF AND ELECTRICAL ASSEMBLIES AND INFORMATION HANDLING SYSTEMS UTILIZING SAME

CROSS REFERENCE TO APPLICATION

This application is a divisional application of Ser. No. 10/991,451, filed Nov. 19, 2004, now U.S. Pat. No. 6,964,884, and entitled "Circuitized Substrates Utilizing Three Smooth-Sided Conductive Layers As Part Thereof, Method of Making Same, and Electrical Assemblies and Information Handling System Utilizing Same" (inventors: B. Chan et al).

TECHNICAL FIELD

The invention relates to circuitized substrates utilizing conductive sheets as part thereof, methods for making such substrates, and to electrical assemblies and information handling systems utilizing such substrates. One primary example of such a circuitized substrate is a printed circuit (or wiring) board (or card) and another is a chip carrier substrate, both of which are produced by the assignee of the present invention.

In Ser. No. 10/354,000, entitled "High Speed Circuit Board And Method For Fabrication" (inventors B. Chan et al), there is defined a multilayered circuitized substrate including two multilayered portions, one of these able to electrically connect electronic components mounted on the substrate to assure high frequency connections there-between. The substrate may further include a "conventional" substrate portion of known materials so as to reduce costs while assuring a structure having an overall thickness deemed satisfactory for use in the respective product field.

In Ser. No. 10/991,532, entitled "Circuitized Substrate Utilizing Smooth-Sided Conductive Layers As Part Thereof, Method of Making Same, And Electrical Assemblies And Information Handling Systems Utilizing Same" (inventors J. Lauffer et al), also filed Nov. 19, 2004, there is defined a circuitized substrate in which two conductive layers (e.g., electroplated copper foils) are bonded (e.g., laminated) to an interim dielectric layer. Each of the two foil surfaces which physically bond to the dielectric are smooth (e.g., preferably by chemical processing) and include a thin, organic layer thereon, while the outer surfaces of both foils are also smooth (e.g., preferably also using a chemical processing step). One of these resulting conductive layers may function as a ground or voltage plane while the other may function as a signal plane with a plurality of individual signal lines as part thereof. An electrical assembly and an information handling system utilizing such a circuitized substrate are also provided, as is a method of making the substrate.

BACKGROUND OF THE INVENTION

As evidenced below from the descriptions of the several cited patents, there are many different approaches to manufacturing printed circuit boards and cards (hereinafter also simply referred to as PCBs), chip carriers and the like substrates. This is true with respect to substrates used in high speed and other final structures. With operational requirements increasing for complex electronic components such as semiconductor chips which mount on circuitized substrates of the types cited above, so too must the host substrate be capable of handling these increased requirements. One particular increased requirement has been the need for higher frequency (high speed) connections between two or more such mounted components, which connections, as stated, occur through the underlying host substrate. By the term "high speed" as used herein is understood to mean signals within a frequency range of from about 3.0 to about 10.0 gigabits per second (GPS) and even higher.

Such high-speed connections are subjected to various detrimental effects, e.g., signal deterioration (also referred to as signal attenuation), caused by the inherent characteristics of such known substrate circuitry wiring. In the particular case of signal deterioration, this effect is expressed in terms of either the "rise time" or the "fall time" of the signal's response to a step change. The deterioration of the signal can be quantified with the formula $(Z_0*C)/2$, where $Z_0$ is the transmission line characteristic impedance, and C is the amount of the connecting "via" capacitance (the "via" being a known plated hole within the substrate to couple different conductive layers). In a signal line (also referred to in the industry as a wire or trace) having a typical 50 ohm transmission line impedance, a plated thru-hole "via" having a capacitance of 4 picofarads (pf) would represent a 100 pico-second (ps) rise-time (or fall time) degradation. This compares to a 12.5 ps degradation with a 0.5 pf buried "via" of the various embodiments taught in the patent application cited above. This difference is significant in systems which operate at 800 MHz or faster (becoming the "norm" in today's technical world), where there are associated signal transition rates of 200 ps or faster.

One factor that can contribute to signal attenuation is surface roughness of the conductive layer through which the signals pass. PCB manufacturers who laminate several dielectric and conductive layers to form the final board structure desire some level of roughness to promote adhesion between the two materials. Unfortunately, such roughness may also adversely affect signal passage if too excessive. As understood from the teachings herein, the instant invention is able to provide conductive layers with optimal roughness for sound adhesion to corresponding dielectric layers during bonding of such layers but also layers that are smooth enough that the surface irregularities of such layers do not significantly impede signal passage.

It is to be understood that the teachings of the present invention are not limited to the manufacture of high speed substrates such as PCBs and the like, but are also applicable to the manufacture of substrates used for other purposes than high speed signal connections. Generally speaking, the teachings herein are applicable to any such substrates in which one or more conductive layers such as copper are bonded (e.g., laminated) to an adjacent dielectric layer and the resulting composite then used as the substrate, typically when combined with other dielectric and conductive layers to form a much thicker, built-up structure. The invention is able to provide a final structure in which signal attenuation is reduced while still assuring effective conductive layer and dielectric layer adhesion.

With respect to the circuit (wiring) patterns being formed on substrates of many types of PCBs, including high speed boards as well as others, line widths may now be as small as ten-odd microns. Accordingly, the conductive layers (some also referred to as metal "foils" in the art) are becoming much thinner than those which produced wider lines in previous substrates. By way of example, when the designated thickness of metal foil for use in the formation of the conventional wiring pattern of about 100 micron line width has ranged from about 15 to 35 microns, the thickness of metal foil utilized in the formation of ten-odd micron wiring patterns must be reduced correspondingly. To accomplish this, an aluminum or copper foil may be used. Preferably, copper is used, especially an electrodeposited copper foil, produced by electrodepositing copper on a drum surface. With respect to such electrodeposited copper foil, the surface at which copper deposition is initiated (the surface at which formation of copper deposits brought into contact with the drum is initiated) is referred to as "shiny side", and the surface at which copper deposition is completed is referred to as "matte side". The surface condition of the shiny side is substantially the same as that of the drum. That is, the RMS surface roughness value (a conventional measurement of metal surface roughness for layers used in PCBs; see more below) of the drum is from about 0.1 to 0.5 microns with a maximum peak to valley roughness value from about 1.0 to 2.0 microns. (Maximum peak to valley roughness is another means of characterizing surface roughness of a metal layer such as copper foil used in PCBs) As a result, the "shiny" side of the electrodeposited copper formed on this drum (and against the drum's outer surface) has a similar roughness. On the other hand, with respect to the outer matte side of the formed copper layer, its surface roughness is greater than the surface roughness of the shiny side, typically having an RMS value of from about 1.0 to about 2.0 microns with a maximum peak to valley roughness in the range of about 3.0 to 10 microns.

There are various different methods of characterizing surface roughness in the industry including Ra (average roughness or the arithmetic average above and below the center line in a segment), Rq (or RMS, which is the square root of the average of the squared absolute distances of the surface profile from the mean line), Rt (maximum peak to valley or the height difference between the highest and lowest points in a segment) and Rz (the 10 point average surface roughness). RMS (Rq) values will be used herein and simply referred to as "RMS roughness" for ease of explanation purposes.

In the case of conventional electrodeposited copper foils, it is known to subject these foils to various treatments prior to inclusion thereof as part of a dielectric-conductive layer composite (or, more likely, a sub-composite if used in combination with other sub-composites to form a multi-layered built-up final board), including treating the foil for the purpose of increasing adhesion between the foil and dielectric layer(s) in the final structure. For example, mechanical polishing is a method of smoothing the surface of the copper foil with the use of mechanical means, usually in the form of a buffer. Unfortunately, if the foil is too thin, it may be damaged, e.g., severed or torn in sections, from the relatively high stresses exerted on the copper foil during this processing. Thus, mechanical polishing is considered suitable for preparing the surface of relatively thick copper foils only. In comparison, chemical and electrolytic polishing processes exert virtually no relatively high stresses on copper foils so it is believed that relatively thin foils may be successfully treated using one or both of these processes. However, such processes are typically expensive to operate, often requiring relatively expensive equipment, costly chemical baths, as well as prolonged periods during which the foil is so treated, thereby extending the total time of manufacture of the end product.

In U.S. Pat. No. 6,475,638 (Mitsuhashi et al), there is described a process for producing an electrodeposited copper foil with its surface prepared which includes the steps of subjecting the foil having a shiny side and a matte side to at least one mechanical polishing so that the average surface roughness (Rz) of the matte side becomes in the range of 1.5 to 3.0 microns. The matte side is then subjected to a selective chemical polishing so that the average surface roughness (Rz) of the matte side becomes in the range of 0.8 to 2.5 microns. The mechanical polishing followed by chemical polishing of the matte side enables the foil to exhibit excellent properties, according to the authors.

In U.S. Pat. No. 6,291,081 (Kurabe et al), there is described a process for producing an electrodeposited copper foil including the steps of subjecting an electrodeposited copper foil having a shiny side and a matte side to a first mechanical polishing and then subjecting the matte side having undergone the first mechanical polishing to a further mechanical polishing. A planar, highly polished face with excellent surface properties is allegedly obtained. Moreover, depressed parts are not polished, so that the amount of copper lost by the polishing steps is extremely minute.

In U.S. Pat. No. 5,897,761 (Tagusari et al), there is described an electrodeposited copper foil for use in the manufacture of printed wiring boards in which the original profile of the matte surface has been completely removed, preferably by buffing, leaving a surface having linear streaks and a certain roughness. The new surface is then given a nodule forming treatment which produces a second surface roughness, which may be followed by a corrosion resisting treatment. U.S. Pat. No. 5,858,517 (also Tagusari et al) also describes a similar process with what are considered minor modifications.

In U.S. Pat. No. 5,545,466 (Saida et al), there is described a copper-clad laminate characterized in that an electrolytic copper foil on the glossy (shiny) surface side of which a copper electrodeposit is formed, is bonded at its glossy surface side to one side or each of both sides of a substrate, which has a fine-pitch wiring (circuit) pattern and exhibits a high etching factor. This patent is a continuation-in-part of U.S. Pat. No. 5,437,914 (Saida et al), below.

In U.S. Pat. No. 5,482,784 (Ohara et al), there is described a printed circuit inner-layer copper foil having inverted tear drop-shaped fine nodules formed on both surfaces of the copper foil, the nodules each having a specific length and maximum diameter.

In U.S. Pat. No. 5,437,914 (Saida et al), there is described a copper-clad laminate characterized in that an electrolytic copper foil on the glossy surface side of which a copper electrodeposit is formed is bonded at its glossy surface side to one side or each of both sides of a substrate.

In U.S. Pat. No. 5,096,522 (Kawachi et al), there is described a process for producing a copper-clad laminate which includes the steps of contacting the surface of a conductive carrier with a catalyst liquid containing a noble metal selected from the group consisting of Pd, Pt, Ru, Au, and Ag, subsequently forming a copper foil layer on the treated surface by copper electroplating, laminating an insulating base on the copper foil layer by hot-press bonding, and then separating the conductive carrier from the resulting laminate. The copper foil layer in the resulting copper-clad laminate is claimed to have fewer pinholes and allegedly exhibits isotropic mechanical characteristics.

In four U.S. Patents cited below with respect to the definition of what is meant by a "fluid treatment device", there are described various embodiments of fluid treatment apparatus/assemblies which are specifically designed for applying precisely directly pressurized jets of fluid onto designated locations on the surface of a nearby material. As defined in these patents, such materials are typically passed through the apparatus/assembly with the fluid directed onto opposite sides thereof from the oppositely positioned sprayers, but may only be directed onto one of the sides, if desired. The various pressures attainable using these structures are defined in detail in many of these patents.

In Japanese Patent Unexamined Publication Hei 5-160208, there is disclosed a tape carrier having a lead pattern formed from an electrodeposited copper foil wherein the overall surface of the foil's matte side has been polished. This publication describes the use of an electrodeposited copper foil whose 1-2 micron matte side surface profile has been chemically polished. It is mentioned that a highly reliable carrier tape with desired lead strength can be provided by the use of the copper foil whose matte side overall surface has been so chemically polished.

According to the teachings of the present invention, there is defined a circuitized substrate in which two outer conductive layers (e.g., electroplated copper foil) are combined with a third, interim conductive layer (e.g., electroplated or rolled, annealed copper foil) and bonded (e.g., laminated) to two interim dielectric layers. Each of the two foil surfaces of the first two conductive layers which physically bond to the interim dielectric layers are smooth while the outer surfaces of both of these foils, albeit rougher than the facing sides, are also smooth. Both opposing surfaces of the third, interim conductive foil are approximately equally smooth. The third conductive layer may function as a ground or voltage plane while the first two conductive layers may function as signal planes each with a plurality of individual signal lines as part thereof. The signal lines may be extremely thin and also extremely narrow in width, in which case these are still able to enable the passage of high speed signals there-through. As stated, however, the invention is not limited to substrates with extremely thin and narrow signal lines, as it is clear from the teachings herein that substrates having thicker and wider lines than defined herein may be successfully produced. The signal lines of the two outer conductive layers may further be electrically coupled to each other with plated via holes.

It is believed that such a substrate and method of making same, as well as resulting electrical assemblies and information handling systems utilizing same, will represent significant advancements in the art.

OBJECTS AND SUMMARY OF THE INVENTION

It is, therefore, a primary object of the present invention to enhance the circuitized substrate art by providing a circuitized substrate having the advantageous features taught herein.

It is another object of the invention to provide a method of making such a circuitized substrate which can be accomplished in a relatively facile manner and at relatively low costs.

It is still another object of the invention to provide an electrical assembly capable of using such a circuitized substrate and thus benefiting from the several advantageous features thereof, It is yet another object of the invention to provide an information handling system capable of utilizing a circuitized substrate as part thereof to thus also benefit from the several advantageous features thereof.

According to one aspect of the invention, there is provided a method of making a circuitized substrate comprising providing a first electrically conductive layer with first and second opposing smooth sides, providing second and third electrically conductive layers each having a first smooth side and a second opposing side of a roughness greater than that of the first smooth sides of the second and third electrically conductive layers, treating the three electrically conductive layers with a chemical treatment so as to minimally increase the roughness of the first and second smooth sides of the first electrically conductive layer and the first smooth sides of the second and third electrically conductive layers, providing first and second dielectric layers, bonding the first and second dielectric layers to the first and second opposing smooth sides of the first electrically conductive layer, respectively, after the treating of the first electrically conductive layer with the chemical treatment, bonding the first smooth sides of both second and third electrically conductive layers to the first and second dielectric layers, respectively, after treating of the first smooth sides of the second and third electrically conductive layers with the chemical treatment, and forming a circuit pattern within at least one of the second and third electrically conductive layers.

According to another aspect of the invention, there is provided a circuitized substrate comprising a first electrically conductive layer with first and second opposing smooth sides, first and second dielectric layers bonded to these first and second opposing smooth sides, respectively, second and third electrically conductive layers each having a first smooth side bonded to the first and second dielectric layers, respectively, these second and third electrically conductive layers each further including a second opposing smooth side, and a circuit pattern formed within at least one of the second and third electrically conductive layers having the first smooth side and the second smooth side.

According to still another aspect of the invention, there is provided an electrical assembly comprising a circuitized substrate comprising a first electrically conductive layer with first and second opposing smooth sides, first and second dielectric layers bonded to these first and second opposing smooth sides, respectively, second and third electrically conductive layers each having a first smooth side bonded to the first and second dielectric layers, respectively, these second and third electrically conductive layers each further including a second opposing smooth side, a circuit pattern formed within at least one of the second and third electrically conductive layers having the first smooth side and the second smooth side, and at least one electrical component positioned on and electrically coupled to the circuitized substrate.

According to yet another aspect of the invention, there is provided an information handling system comprising a housing, a circuitized substrate positioned within the housing and including a first electrically conductive layer with first and second opposing smooth sides, first and second dielectric layers bonded to these first and second opposing smooth sides, respectively, second and third electrically conductive layers each having a first smooth side bonded to the first and second dielectric layers, respectively, these second and third electrically conductive layers each further including a second opposing smooth side, a circuit pattern formed within at least one of the second and third electrically conductive layers having the first smooth side and the second smooth side, and at least one electrical component positioned on and electrically coupled to the circuitized substrate.

BEST MODE FOR CARRYING OUT THE INVENTION

Figure 1:
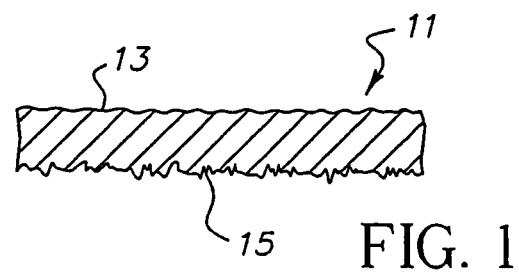
FIGS. 1-4 are much enlarged, partial side elevational views, in section, which illustrate four of the steps used to make a circuitized substrate according to one embodiment of the invention.

For a better understanding of the present invention, together with other and further objects, advantages and capabilities thereof, reference is made to the following disclosure and appended claims in connection with the above-described drawings. Like figure numbers will be used from FIG. to FIG. to identify like elements in these drawings.

By the term "circuitized substrate" as used herein is meant to include substrates having at least two dielectric layers and at least three metallurgical conductive layers. Examples include structures made of dielectric materials such as fiber-glass-reinforced epoxy resins (some referred to as "FR-4" dielectric materials in the art), polytetrafluoroethylene (Teflon), polyimides, polyamides, cyanate resins, polyphenylene ether resins, photoimageable materials, and other like materials wherein the conductive layers are each a metal layer (e.g., power, signal and/or ground) comprised of suitable metallurgical materials such as copper (preferably electrode-posited copper foil as defined herein-above), but in the broader aspects may also include additional metals (e.g., nickel, aluminum, etc.) or alloys thereof. Further examples will be described in greater detail herein-below. If the dielectric materials for the structure are of a photoimageable material, it is photoimaged or photopatterned, and developed to reveal the desired circuit pattern, including the desired opening(s) as defined herein, if required. The dielectric material may be curtain-coated or screen-applied, or it may be supplied as dry film. Final cure of the photoimageable material provides a toughened base of dielectric on which the desired electrical circuitry is formed. An example of a specific photoimageable dielectric composition includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photoinitiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photoimageable dielectric composition. The dielectric layers taught herein may be typically about 2 mils to about 4 mils thick, but also thicker if desired. Examples of circuitized substrates include printed circuit boards (or cards), hereinafter referred to also as PCBs, and chip carriers. It is believed that the teachings of the instant invention are also applicable to what are known as "flex" circuits (which use dielectric materials such as polyimide).

By the term "electrical component" as used herein is meant components such as semiconductor chips, resistors, capacitors and the like, which are adapted for being positioned on the external conductive surfaces of such substrates as PCBs and chip carriers, and possibly electrically coupled to other components, as well as to each other, using, for example the PCB's or chip carrier's internal and/or external circuitry.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. Perhaps the most well known such assembly is the conventional PCB having several external components such as resistors, capacitors, modules (including one or more chip carriers) etc. mounted thereon and coupled to the internal circuitry of the PCB.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Such systems typically include one or more PCBs, chip carriers, etc. as integral parts thereof. For example, a PCB typically used includes a plurality of various components such as chip carriers, capacitors, resistors, modules, etc. mounted thereon. One such PCB can be referred to as a "motherboard" while various other boards (or cards) may be mounted thereon using suitable electrical connectors.

By the term "smooth" as used herein to define the surface roughness of a side of an electrically conductive layer such as an electrodeposited copper foil is meant a layer side having an RMS surface roughness of from about 0.1 to about 0.6 microns.

By the term "fluid treatment device" as used herein is meant a pressurized fluid spray apparatus/assembly adapted for precisely directing pressurized jets of fluid onto the surface of a material, typically as the material is passed therethrough in the situation where such jets impinge from opposite sides of the material or, in its simplest form, where such apparatus/assembly utilizes such jets only on one side of the material and thus fluid is impinged on only said side. Apparatus/assemblies of this type are defined in U.S. Pat. Nos. 5,512,335 (Miller et al), 5,378,307 (Bard et al), 5,289,639 (Bard et al) and 5,063,951 (Bard et al), the teachings of these patents being incorporated herein by reference. In its simplest form, such as shown in U.S. Pat. Nos. 5,063,951 and 5,289,639, the device will include a plurality of such jets oriented in rows under or over which the material being treated will pass and receive pressurized fluid, e.g., etchants, water rinse, etc. thereon. Additional structure, such as vibration means may be utilized, as defined in U.S. Pat. No. 5,512,335, as well as an overflow sump arrangement with a plurality of such devices spacedly positioned there-along. An example of this latter apparatus/assembly is defined in U.S. Pat. No. 5,378,307.

In FIG. 1, a foil 11 of electrically conductive material, preferably "standard" or "plain and stable" electrodeposited copper foil, is shown. As stated below, at least two of these foils are used in the invention and form respective conductive layers for the produced circuitized substrate. In a preferred embodiment, these two foils will serve as signal layers, but the invention is not so limited. In electrodeposited foil form, foil 11 includes a first side 13 and a second, opposing side 15. By way of example, side 13, the "drum" side (meaning it was formed against the drum surface), preferably includes an RMS roughness of about 0.1 to about 0.5 microns and can thus be defined as falling within the "smooth" range stipulated above. The maximum peak-to-valley roughness (hereinafter PTV roughness) value for this side is preferably from about 1.0 micron to about 2.0 microns with an optimal value being 1.5 microns. Side 15, referred to as the "matte" side (meaning it was not against the drum), is rougher and, in this same example, preferably possesses a roughness using the same RMS standard of about 1.0 to about 3.0 microns with a maximum PTV roughness from about 2.5 to about 10.0 microns. As such, side 15 in this original configuration does not meet the definition of "smooth" as defined herein. By the term "plain and stable" when defining electrodeposited copper foil is meant a copper foil that has not received additional surface roughening treatment (e.g. a secondary nodular plating), but may have been given a known chemical anti-stain treatment. By the term "standard" when defining electrodeposited copper foil is meant a copper foil that has received an additional roughening treatment (e.g. a secondary nodular plating) to its' matte surface, and has additionally received a chemical anti-stain treatment to both surfaces. Either type of such electrodeposited foils is well adapted for use in the present invention, as are others (e.g., "rolled copper" described below) known in the art. Understandably, the surface topographies depicted in the drawings are exaggerated for illustration purposes and are not meant to accurately illustrate the actual roughness of said surfaces.

As stated, a key aspect of this invention is the provision of smooth surfaced conductive layers in a final product which serve to substantially prevent signal attenuation when signals are passed there-through, but which are also "rough" enough to promote secure adhesion to corresponding dielectric layers when bonded thereto including such relatively harsh PCB production processes as lamination. This requisite laminate adhesion value is deemed to be at least three pounds per linear inch of the copper surface.

Figure 3:
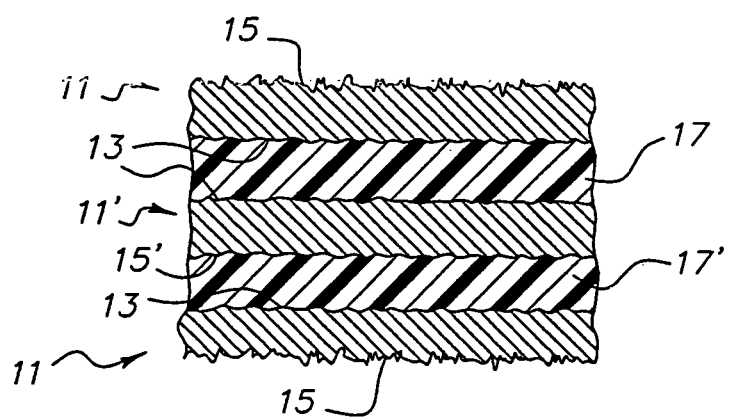

To accomplish the above using the new and unique teachings herein, at least three conductive layers 11 are utilized in a circuitized substrate having such three conductive layers separated by two interim dielectric layers. This initial construction is shown in FIG. 3 prior to subsequent processing defined subsequently. Conductive layers such as layer 11 shown in FIG. 1 may form each of these three layers, when prepared in the manner defined herein. At least two of these are of the electrodeposited type defined above having the initial roughness values stated above, and a third may be of the "rolled copper" type, a foil of copper material taken from a roll of such material formed in accordance with known processes for forming rolled conductive copper. It is also possible to use electrodeposited copper for all three conductive layers in this invention, and the following description will be in that context.

Figure 2:
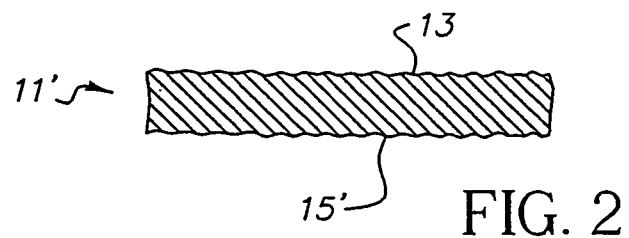

If layer 11 is an electrodeposited copper foil having the roughness values stated above and is to be used as the middle conductive layer for the invention, and thus possibly serve as a power or ground layer, it needs to be further processed to render all sides smooth enough before bonding to other layers. Therefore, the "rougher" side 15 must be further reduced in roughness so as to qualify under the "smooth" definition herein-above. To accomplish this, side 15 is passed through a fluid treatment device and thereby subjected to a fluid etch process in which etchant (a preferred example being cupric chloride) is sprayed onto surface 15 using a fluid treatment device of the type defined herein-above. Representative examples of such fluid treatment devices are defined and illustrated in one or more of the four patents cited above. During such processing, the etchant is sprayed at a pressure of from about 5 pounds per square inch (p.s.i.) to about 20 p.s.i. onto exposed surface 15, reducing the roughness of this surface. In one example, the 1.0 to 3.0 micron RMS roughness was reduced to about 0.1 to about 0.5 RMS roughness, which is about the same as for side 13. As represented in the patents cited previously, solution flow is directed from the treatment device used laterally across surface 15, which acts to erode the high points on the surface at the fastest rate, thus resulting in a surface 15' (FIG. 2) with significant roughness reduction as indicated above. Surface 15 is thus now "smooth" per the definition above.

If foil 11 in FIG. 1 is provided as a rolled copper foil, the above processing is not necessary because such a foil may be provided initially with both opposing sides 13 and 15 having an RMS roughness which meets the "smooth" definition. By way of example, a rolled copper foil having an RMS roughness of about 0.1 to about 0.3 microns and a peak of about 1.0 to about 1.5 microns for both surfaces may be used.

The foil 11, in either the rolled copper form or the reduced electrodeposited copper form, is now subjected to a chemical treatment process to slightly increase the roughness values of both opposing sides while still maintaining the surface roughness values for same in the "smooth" range. One preferred process involves processing the invention's foils through what is referred to as a "BondFilm" solution currently available on the marketplace under this name from Atotech Deutschland GmbH, an international company having a U.S.A. business address at 1750 Overview Drive, Rock Hill, S.C. BondFilm solution is comprised primarily of three components: (1) sulfuric acid; (2) hydrogen peroxide; and (3) copper, as well as additional Atotech Deutschland GmbH proprietary constituents. This process is also referred to as an oxide alternative process, meaning that it does not result in the formation of oxide layers on the treated material. By way of example, the RMS roughness values for each side 13 and 15' are now raised slightly to from about 0.15 microns to about 0.6 microns with a peak of about 1.2 to about 2.2 microns. The BondFilm process involves immersing the foil in the solution for a period of from about 5 to about 120 seconds at a solution temperature of about 20 to 35 degrees Celsius (C.). As part of this treatment, each external surface 13 and 15' is initially cleaned and degreased, following which a micro-etch of the surfaces of both sides occurs. Finally, a thin organic coating is applied to both of these surfaces. In one example, this thin organic coating is benzotriazole and possesses a thickness of from about 50 Angstroms to about 500 Angstroms. This thin coating remains on the external surfaces of both sides, including later when these sides are bonded (e.g., laminated) to the invention's two dielectric layers 17 and 17' (FIG. 3). Such bonding is preferably accomplished using conventional PCB lamination processing, and further description is not deemed needed.

In FIG. 3, center foil 11' (the foil from FIG. 2 after having the defined chemical treatment) is oriented between two opposing dielectric layers 17 and 17'. Preferred examples of such dielectric materials for layers 17 and 17' include fiberglass-reinforced epoxy resins, polytetrafluoroethylene (Teflon, a trademark of E. I. DuPont deNemours and Company), polyimides, polyamides, cyanate resins, polyphenylene ether resins and photoimageable materials, the most preferred of these being fiberglass-reinforced epoxy resin material known also in the PCB art as "FR-4" material (for its fire retardant rating). In one example, copper conductive layer 11' possesses an initial thickness of from about 1 mil (thousandths of an inch) to about 3 mils, while the initial thickness of each layer 17 and 17' is from about 2 mils to about 15 mils.

Figure 4:
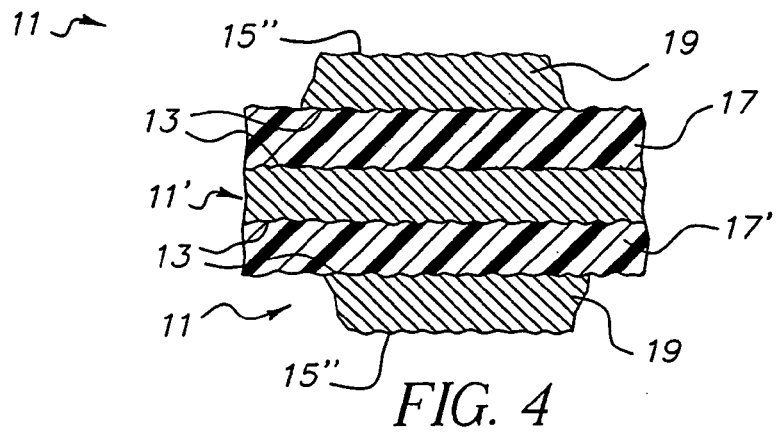
Figure 5:
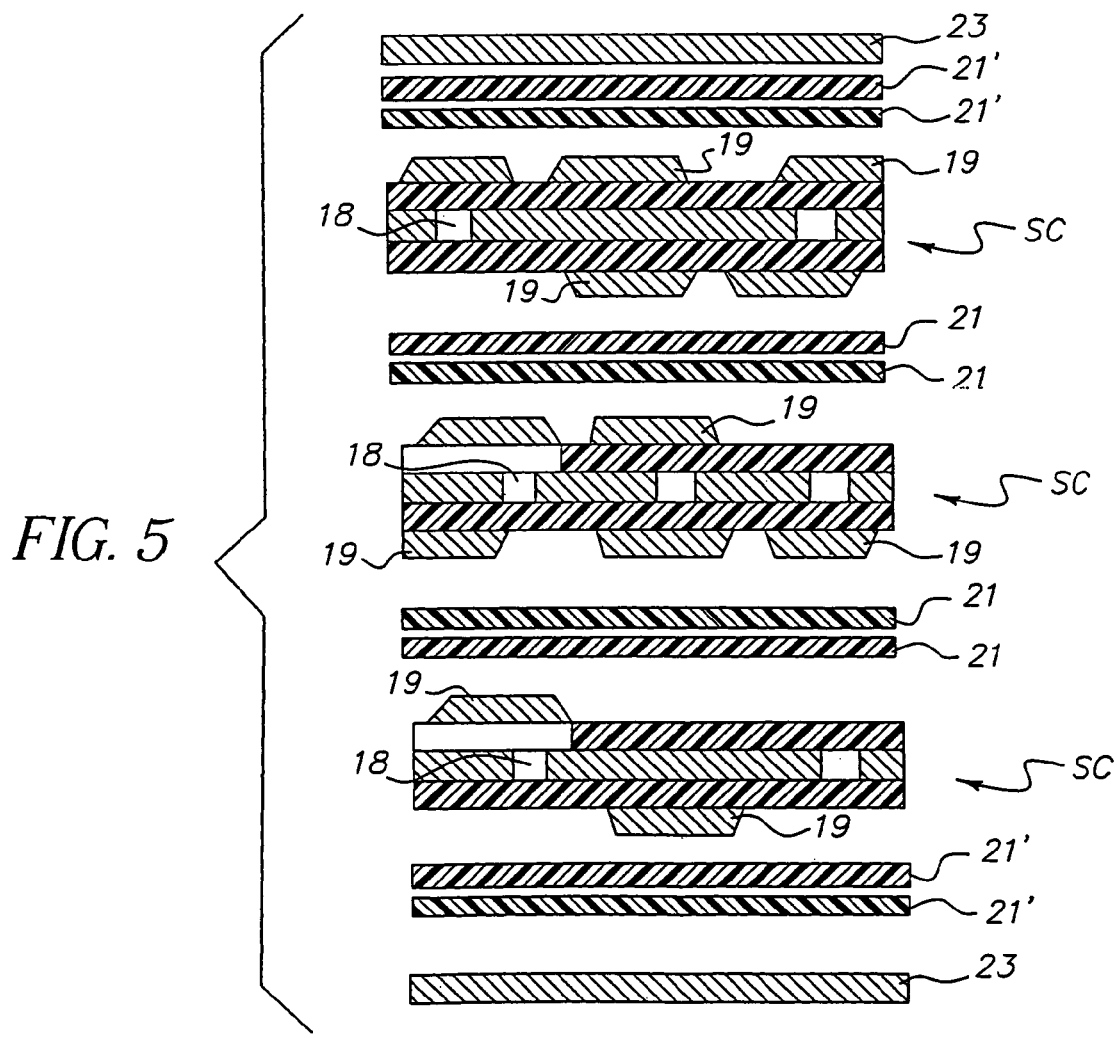
FIG. 5 is an exploded side elevational view illustrating a multi-layered circuitized substrate in which several additional layers over those shown and defined for the circuitized substrate in FIGS. 1-4 are used; including using three of the substrates formed in FIGS. 1-4 as subcomponents (or subcomposites) of this multi-layered structure.

To complete the substrate in its simplest form, two outer conductive layers 11 are also provided in FIG. 3. Preferably, each outer layer is electrodeposited copper foil having the dimensions stated for foil 11 in FIG. 1. As such, each will include its original rough outer surface 15 having an RMS roughness preferably from about 1.0 to about 3.0 microns with a peak of 2.5 to 10 microns. Prior to aligning with and bonding to the respective shown dielectric layers 17 and 17', each foil 11 is also subjected to the above BondFilm processing, such that the RMS roughness for the interior sides 13 is raised slightly to 0.15 to about 0.6 micron RMS roughness and the peak to about 1.2 to about 2.2 microns, with a nominal of 1.7 microns. As above with respect to interim layer 11', each exterior surface of the foils 11 prior to bonding will include a thin organic layer, possibly of the above material and having the above thickness. (Notably, these organic film layers, being so thin, are not shown for ease of illustration.) The outer surfaces 15 will have increased roughness values raised from the above initial values to about 1.05 to about 3.05 micron RMS roughness with a corresponding peak raised slightly to 2.55 to about 10.05 microns. As such, these surfaces, including the thin organic films as well, will still be rough enough not to qualify as "smooth" according to the teachings herein. Further treatment of surfaces 15 is now necessary, and this is preferably accomplished following lamination of all layers shown in FIG. 3. To achieve this, the resulting sub-composite as shown in FIG. 3 is preferably subjected to a fluid treatment process as defined above wherein etchant is sprayed onto the outer surfaces 15 by passing this subcomposite through a fluid treatment device of the above type. As mentioned above, during such processing, the etchant is preferably sprayed at a pressure of from about 5 pounds per square inch (psi) to about 20 psi onto exposed surfaces 15, reducing the roughness of this surface. In one example, the 1.05 to 3.05 micron RMS roughness was reduced to only about 0.1 to about 0.5 RMS roughness, which is about the same as for the surfaces of the opposite sides 13. As represented in the patents cited previously, solution flow is directed from the treatment device laterally across surfaces 15, which acts to erode the high points on the surfaces at the fastest rate, thus resulting in a surface 15". Surfaces 15" (FIG. 4) are now "smooth" per the definition above, and adapted for further lamination to other dielectric layers or, if no additional layers are desired, to serve simply as conductors such as signal lines or pads 19 on the external surface of the substrate, following formation of any desired additional conductive elements such as signal lines or pads or the like thereon. More explanation as to such formation is provided below. Either way, one example of a final configuration for these outer layers is shown in FIG. 4, and alternative configurations depicted for similar sub-composites (referenced by the letters "SC") are shown in FIG. 5. Following bonding (e.g., using conventional lamination pressures and temperatures) and the defined chemical treatment, the resulting five-layered substrate shown in FIG. 4 will preferably possess a thickness within the range of from less than about 5 mils to about 40 mils, the reduction in thickness resulting from the compression of the interim dielectric material due to the pressures of lamination. Understandably, the copper for each of the three conductive layers will maintain its original thickness.

Although it is shown in FIG. 4 to provide smooth outer surfaces 15" following bonding of the smooth inner surfaces 13, this is not meant to limit the invention because it is also possible to form such smooth outer surfaces prior to the bonding. This may be accomplished by suitable retention means (not shown) for holding the foils in position while subjecting the exposed surfaces thereof to the fluid treatment process. As defined in the subject fluid treatment device patents, such retention is possible using suitable rollers or the like which direct the sheets of material to be treated through or over or under the device, depending on which device is used and how. If the foil material is to pass either over or under, the exposed foil surfaces need only pass adjacent the device sprayers. Understandably, passing the foils through one of the devices enables simultaneous treatment of both surfaces, if desired, including the situation wherein one surface is rendered more rough or smooth than the other, e.g., by adjusting the chemical formulations of the sprayed solutions and/or the spray impingement force.

It is understood that in its simplest form, the structure depicted in FIG. 4, having a minimum of three conductive layers and two insulating interim dielectric layers, may function as a circuitized substrate. Preferably, the substrate in FIG. 4 will serve as a "core" having two outer signal planes (layers), two adjacent dielectric planes (layers), and one middle or center power or ground plane (layer). As such, this substrate may then be used solely, or, more preferably, with other similar "cores" as part of a multi-layered circuitized substrate such as shown in exploded form in FIG. 5. In one example, the final structure may include no less than ten dielectric and conductive layers and, with respect to more complex final substrate products such as PCBs for products such as information handling systems, may include as many as thirty or more total conductive and dielectric layers. If the middle conductive layer is to serve as a ground or power plane, it is desirable to provide a plurality of clearance openings 18 (a total of seven shown for the three sub-composite substrates shown in FIG. 5, but several are possible for each layer) within the layers for allowing formation of thru-holes in the larger product in which such holes are desired. If such openings 18 are provided, this is preferably done by etching or mechanical drilling and occurs preferably prior to bonding of foil 11' to interim dielectric layers 17. Clearance holes of this type are known in art and further description not considered necessary.

Formation of signal conductors 19 (only two shown in FIG. 4 but other possible combinations shown in FIG. 5) is preferably achieved using conventional photolithographic processing known in the art in which a photo-resist (not shown) is applied over the upper conductive layer, patterned and exposed (through the pattern), and the photo-resist then "developed" to enable removal of selected portions of the underlying metal in this layer and the formation of several conductors 19. In a preferred example, conductors 19 are in the form of very thin signal lines having a width of only about three mils and a thickness of about 0.5 mils. The lines are in turn spaced apart only six mils from center-to-center to give an excellent idea of the highly dense circuit pattern attainable using the teachings herein. If the upper conductive layer is not used solely as a signal layer, the conductors may also be in the form of pads, such as those adaptable for having a solder connection formed thereon should the pad be on the upper surface of the resulting substrate. Alternative structures for conductors 19 are also possible.

It is understood that the structure depicted in FIG. 4 may further include conductive thru holes (not shown but well known in the industry) to electrically couple the two outer foils 11 to each other, including through the interim foil 11'. These thru holes may extend entirely through the substrate's two dielectric layers and the interim conductive layer (through the described clearance holes) to couple selected portions (e.g., signal lines, if the outer foils are signal planes) thereof. Such conductive thru holes will of course be isolated from the interim conductive layer and thus not connected thereto. However, it is also understood that it might be desired to electrically couple one or more of the outer foils 11 to the third, interim foil 11', which would also be accomplished with a conductive thru hole. Such connections may be desired, e.g., for grounding selected conductors of the outer foil(s). Conductive thru holes of the above types are known, and also referred to in the art as plated through holes (PTHS) if extending completely through the substrate, "buried vias" if encased within the substrate, and "blind vias" if extending from an external surface to a predetermined distance within the substrate. All of these types are readily possible for use within the instant invention, and are typically formed by mechanical or laser means, and then plated with copper or another excellent conductive material. Further description is not considered necessary.

In FIG. 5, three of the circuitized substrates (each referred to as SC) shown in FIG. 4 are now aligned with two dielectric layers 21 between adjacent pairs of the substrates and two added pairs of dielectric layers 21' positioned externally of the outermost two substrates. Each of these layers 21 and 21' is preferably a B-staged fiberglass-reinforced epoxy resin material known also in the PCB art as "FR-4" material and has an initial thickness of only about 1 mil to 5 mils. As mentioned above, such layers are known in the art and further description is thus not considered necessary. In addition to these, at least one conductive layer 23 (preferably copper, having a thickness of about 0.5 mils) is positioned outside each of the outermost pair of dielectric layers 21'. These outer conductive layers function as the outer conductors for the finished multi-layered circuitized substrate shown in FIG. 5, following lamination of the several layers and substrates, preferably using conventional PCB lamination processing.

Figure 6:
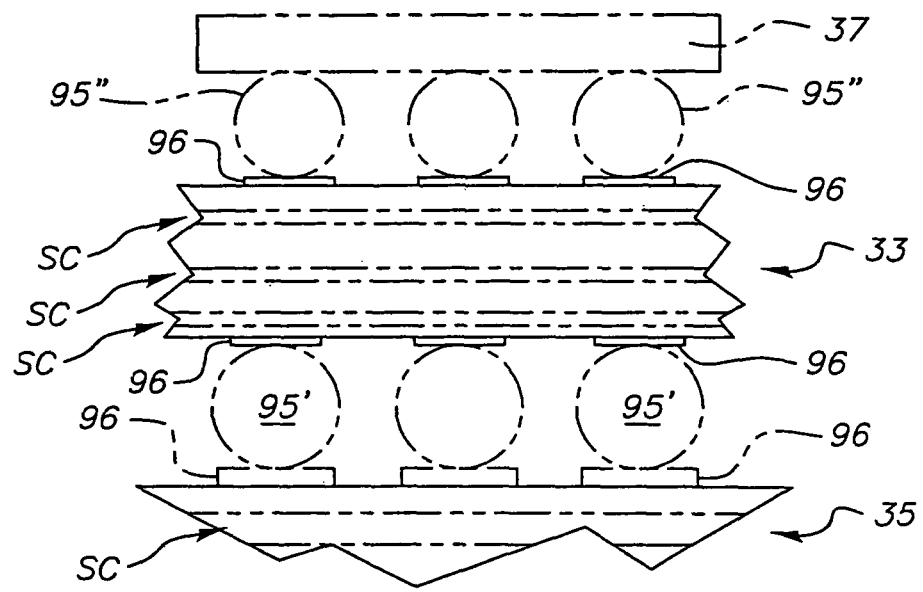
FIG. 6 is a partial, side elevational view, showing the multi-layered substrate of FIG. 5 functioning as a chip carrier in one aspect, and as a PCB in another aspect, thus illustrating two different types of electrical assemblies adapted for using one or more of the circuitized substrates of the present invention.

FIG. 6 illustrates two electrical assemblies 33 and 35 attainable using the teachings herein. Assembly 33 is understood to be a chip carrier or similar structure on which is positioned at least one semiconductor chip 37 preferably using a plurality of solder balls 95", while assembly 35 is understood to be a typically larger PCB or similar structure on which such a carrier is usually positioned and electrically coupled thereto, again preferably using solder balls 95' of the same or different solder composition as that used for solder balls 95". Significantly, each assembly 33 and 35 preferably includes at least one and perhaps several substrates of the type formed herein. Coupling of the chip, carrier and PCB using solder balls as shown understandably utilizes various conductive (e.g., copper) pads 96 which are coupled in the paired orientation as shown. Such solder ball and pad connections are known in the art. Pads 96 can also be formed as part of the end (upper surface) substrate.

Figure 7:
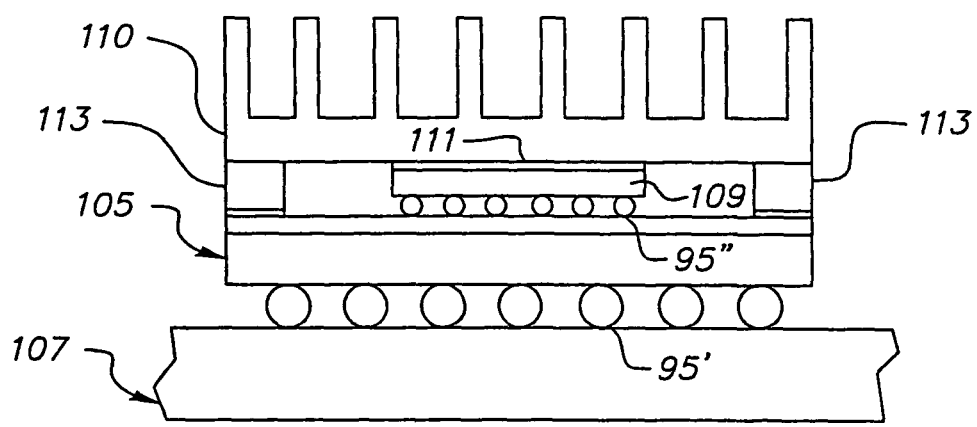
FIG. 7 is a side elevational view showing two electrical assemblies of the type above, in greater detail.

FIG. 7 represents examples of the structures defined herein-above, the structure referenced by the numeral 105 being a chip carrier similar to assembly 33 in FIG. 6, while the structure represented by the numeral 107 is a PCB and thus similar to assembly 35 in FIG. 6. As stated, both such PCB and chip carrier assemblies are produced and sold by the assignee of the invention. In the embodiment (assembly) of FIG. 7, the chip carrier 105 is mounted on and electrically coupled to PCB 107 using a plurality of the aforementioned solder balls 95', the chip carrier 105 in turn having the semiconductor chip 109 (similar to chip 37) positioned thereon and electrically coupled to the carrier using the second plurality of solder balls 95". The assembly in FIG. 7, in greater detail than the structure of FIG. 6 in some respects, may also include a heat sink 110 thermally coupled to the chip 109, e.g., using a conductive paste 111, and positioned on the upper surface of carrier 105 by appropriate standoffs 113, as is known in the art. It is also within the scope of those skilled in the art to utilize an encapsulant material (not shown) to substantially encase the chip and also to eliminate the heat sink if such an encapsulant material is used. Encapsulant material is also possible about the lower pluralities of solder balls 95'. It is even further within the scope of the invention to couple chip 109 using conventional wire-bonding in which a plurality of fine wires (not shown) are bonded between chip conductor sites and corresponding conductor pads on the underlying substrate.

Figure 8:
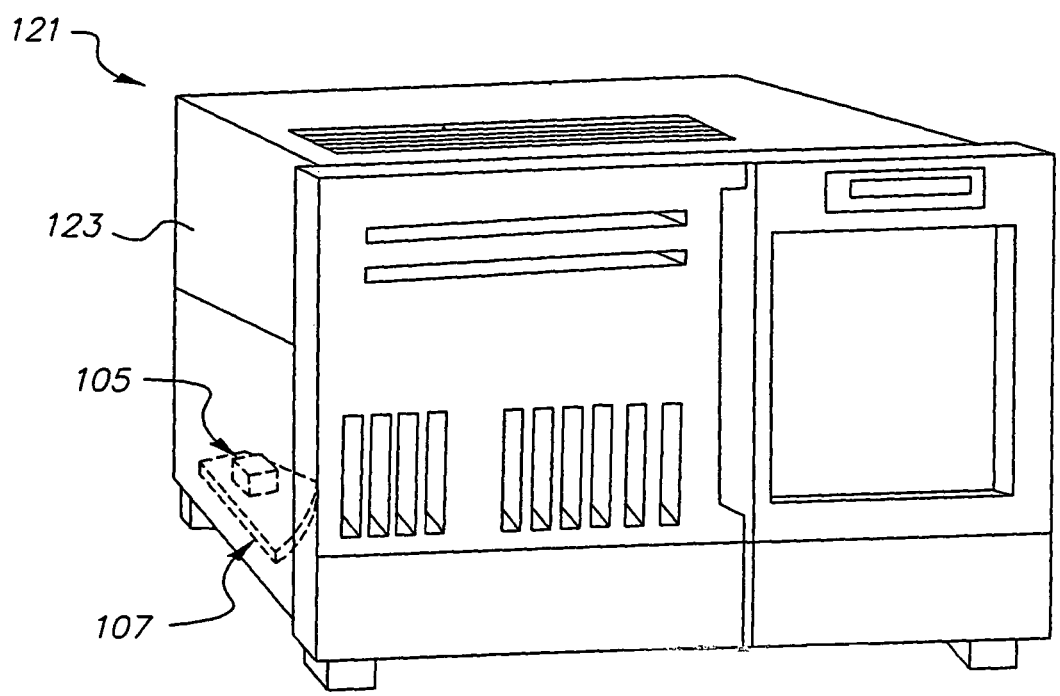
FIG. 8 is a perspective view, on a much reduced scale, showing an information handling system adapted for using one or more of the electrical assemblies and circuitized substrates taught herein.

In FIG. 8, there is shown an information handling system 121 which is preferably a personal computer, a mainframe computer or a computer server. Other types of information handling systems known in the art of this type may also utilize the teachings of this invention. The circuitized substrate or substrates as formed in accordance with the teachings herein may be utilized in the system 121 as a PCB 107 (shown hidden) and/or a chip carrier 105 (also shown hidden). The circuitized substrates may be utilized as a mother board in system 121 or as one or more individual PCBs typically utilized in such systems. As is known, systems 121 are usually contained within a suitable metal or insulative housing such as shown by the numeral 123, with appropriate venting (if desired) therein, as well as instrumentation externally accessible for system operation by the system's designated operator. The remaining elements of information handling systems of these types are known in the art and further description is not believed necessary.

Thus there has been shown and described a circuitized substrate which utilizes at least two dielectric layers on opposite sides of a middle conductive layer and two outer conductive layers on the two dielectric layers, respectively. This substrate is formed in a new and unique manner so as to enhance the passage of high speed and other signals therethrough. The conductive foils rendered substantially "smooth" on each surface in accordance with the teachings herein exhibited significantly lower signal (attenuation) losses at the 1.5 GHz (gigahertz) range. Additionally, as frequencies increased (e.g., from about 1 to about 10 GHz), the rate of loss (in decibels per inch) dropped significantly in comparison to the copper layers of greater roughness. In one example of the invention, two separate substrates were prepared. One was prepared having 1.4 mil thick circuit lines with corresponding widths of 5 mils each. The copper surface RMS roughness was 0.3 microns on one side and 1.5 microns on the other side for this one substrate. Polyclad LD-621 (a glass cloth reinforced polyphenylene ether resin dielectric material available from Cookson Electronics having an office at 144 Harvey Road, Londonderry, N.H.) was used as the dielectric material. Measured signal attenuation for a 20 centimeter signal line length at a frequency of about 1.5 GHz was 1.5 dBs (decibels). In sharp comparison, the second substrate prepared of the same dielectric and copper materials and thicknesses according to the teachings of this invention used copper foils with an RMS surface roughness of 0.3 microns on both sides of the foils. The measured signal attenuation for the signal lines of this second substrate was significantly lower, at about only 1.2 dBs.

The various structures which may utilize one or more circuitized substrates taught herein thus also inherit the several advantageous features of this structure. The circuitized substrate as defined may be produced using known PCB and/or chip carrier or the like manufacturing processes and are thus producible at relatively low cost, enabling the passage of such low costs on to assemblies utilizing these substrates.

While there have been shown and described what are at present the preferred embodiments of the invention, it will be obvious to those skilled in the art that various changes and modifications may be made therein without departing from the scope of the invention as defined by the appended claims.

What is claimed is:

1. A circuitized substrate comprising:
 a first electrically conductive layer with first and second opposing major surfaces, both of said surfaces having an RMS roughness value less than approximately 0.6 micron;
 a thin organic layer disposed on said first and second opposing major surfaces;
 first and second dielectric layers directly bonded to said first and second opposing major surfaces, respectively;
 second and third electrically conductive layers each having a first smooth side directly bonded to said first and second dielectric layers, respectively, said second and third electrically conductive layers each further including a second opposing side, all of said second and third layer first and second sides having an RMS roughness value less than approximately 0.6 micron; and
 a circuit pattern formed within at least one of said second and third electrically conductive layers having said first smooth surface and said second surface, whereby said substrate is formed with a polymer alternative.

2. The circuitized substrate of claim 1 wherein said first, second and third electrically conductive layers each comprises copper or copper alloy material.

3. The circuitized substrate of claim 2 wherein said copper or copper alloy material is electrodeposited copper.

4. The circuitized substrate of claim 1 further including a thin organic layer on said first and second sides of said first electrically conductive layer and said sides of said second and third electrically conductive layers, said thin organic layer comprising benzotriazole and having a thickness of from about 50 Angstroms to about 500 Angstroms.

5. The circuitized substrate of claim 1 further including additional dielectric and electrically conductive layers on opposite sides of said circuitized substrate having said first and second dielectric layers and said first, second and third electrically conductive layers, and a circuit pattern within selected ones of said additional electrically conductive layers.

6. The circuitized substrate of claim 5 wherein the total number of dielectric layers and electrically conductive layers within said circuitized substrate is greater than ten.

7. An electrical assembly comprising:
 a circuitized substrate including a first electrically conductive layer with first and second opposing major surfaces, a thin organic layer disposed on first and second dielectric layers directly bonded to said first and second opposing major surfaces, respectively, second and third electrically conductive layers each having a first surface directly bonded to said first and second dielectric layers, respectively, said second and third electrically conductive layers each further including a respective second opposing surface, all of said surfaces having an RMS roughness value of less than approximately 0.6 micron,
 a circuit pattern formed within at least one of said second and third electrically conductive layers; and
 at least one electrical component positioned on and electrically coupled to said circuitized substrate.

8. The electrical assembly of claim 7 wherein said at least one electrical component comprises a semiconductor chip and said circuitized substrate is a chip carrier substrate.

9. The electrical assembly of claim 7 further including a thin organic layer on said first and second sides of said first electrically conductive layer and said sides of said second and third electrically conductive layers, said thin organic layer comprising benzotriazole and having a thickness of from about 50 Angstroms to about 500 Angstroms.

10. The electrical assembly of claim 7 wherein said first, second and third electrically conductive layers comprises copper or copper alloy material.

11. The electrical assembly of claim 10 wherein said copper or copper alloy material is electrodeposited copper.

12. The electrical assembly of claim 7 further including additional dielectric and electrically conductive layers on opposite sides of said circuitized substrate, said first and second dielectric layers, and said first, second and third electrically conductive layers, and a circuit pattern within selected ones of said additional electrically conductive layers.

13. The electrical assembly of claim 12 wherein the total number of dielectric layers and electrically conductive layers within said circuitized substrate is greater than ten.

14. An information handling system comprising:
 a housing;
 a circuitized substrate disposed in said housing and including a first electrically conductive layer with first and second opposing major surfaces, a thin organic layer disposed on first and second dielectric layers directly bonded to said first and second opposing major surfaces, respectively, second and third electrically conductive layers each having a first surface directly bonded to said first and second dielectric layers, respectively, said second and third electrically conductive layers each further including a respective second opposing surface, all of said surfaces having an RMS value less than approximately 0.6 micron, a circuit pattern formed within at least one of said second and third electrically conductive layers; and
 at least one electrical component positioned on and electrically coupled to said circuitized substrate.

15. The invention of claim 14 wherein said information handling system comprises a personal computer.

16. The invention of claim 14 wherein said information handling system comprises a mainframe computer.

17. The invention of claim 14 wherein said information handling system comprises a computer server.

* * * * *